US 6,643,169 B2

(12) United States Patent
Rudelic et al.

(10) Patent No.: US 6,643,169 B2
(45) Date of Patent: Nov. 4, 2003

(54) VARIABLE LEVEL MEMORY

(75) Inventors: John C. Rudelic, Folsom, CA (US); Richard E. Fackenthal, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/955,282

(22) Filed: Sep. 18, 2001

(65) Prior Publication Data

US 2003/0053333 A1 Mar. 20, 2003

(51) Int. Cl.[7] .............................................. G11C 11/34
(52) U.S. Cl. ............................ 365/185.03; 365/185.28
(58) Field of Search ......................... 365/185.28, 185.03

(56) References Cited

U.S. PATENT DOCUMENTS 5,424,978 A * 6/1995 Wada et al. ................. 365/184
5,515,317 A * 5/1996 Wells et al. ................. 395/427
5,812,447 A   9/1998 Inoue ......................... 365/168
6,097,637 A   8/2000 Bauer et al. ............. 365/185.24
6,097,639 A * 8/2000 Choi et al. .............. 365/185.28
6,363,008 B1 * 3/2002 Wong ...................... 365/185.03

FOREIGN PATENT DOCUMENTS

EP          0 788 113 A1       8/1997

* cited by examiner

*Primary Examiner*—Michael Tran
(74) *Attorney, Agent, or Firm*—Trop, Pruner & Hu, P.C.

(57) ABSTRACT

There exists a tradeoff between the fidelity of data storage and the number of bits stored in a memory cell. The number of bits may be increased per cell when fidelity is less important. The number of bits per cell may be decreased when fidelity is more important. A memory, in some embodiments, may change between storage modes on a cell by cell basis.

56 Claims, 3 Drawing Sheets

VARIABLE LEVEL MEMORY

BACKGROUND

This invention relates generally to memory devices and particularly to memory devices with a multi-level cell architecture.

A multi-level cell memory is comprised of multi-level cells, each of which is able to store multiple charge states or levels. Each of the charge states is associated with a memory element bit pattern.

A flash EEPROM memory cell, as well as other types of memory cells, is configurable to store multiple threshold levels ($V_t$). In a memory cell capable of storing two bits per cell, for example, four threshold levels ($V_t$) are used. Consequently, two bits are designated for each threshold level. In one embodiment, the multi-level cell may store four charge states. Level three maintains a higher charge than level two. Level two maintains a higher charge than level one and level one maintains a higher charge than level zero. A reference voltage may separate the various charge states. For example, a first voltage reference may separate level three from level two, a second voltage reference may separate level two from level one and a third reference voltage may separate level one from level zero.

A multi-level cell memory is able to store more than one bit of data based on the number of charge states. For example, multi-level cell memory that can store four charge states can store two bits of data, a multi-level cell memory that can store eight charge states can store three bits of data, and a multi-level cell memory that can store sixteen charge states can store four bits of data. For each of the N-bit multi-level cell memories, various memory element bit patterns can be associated with each of the different charge states.

The number of charge states storable in a multi-level cell, however, is not limited to powers of two. For example, a multi-level cell memory with three charge states stores 1.5 bits of data. When this multi-level cell is combined with additional decoding logic and coupled to a second similar multi-level cell, three bits of data are provided as the output of the two-cell combination. Various other multi-level cell combinations are possible as well.

The higher the number of bits per cell, the greater the possibility of read errors. Thus, a four bit multi-level cell is more likely to experience read errors than a one bit cell. The potential for read errors is inherent in the small differential voltages used to store adjacent states. If the stored data is potentially lossy, sensitive data stored in relatively high-density multi-level cells may be subject to increased error rates.

In many applications, the nonvolatile memories store a large amount of data that is tolerant to a small number of bit errors. Applications may also have a small amount of data that is not tolerant to bit errors. Examples of such applications may include control structures, header information, to mention a few examples. These typical applications, where a relatively small amount of the overall storage requires higher fidelity, may include digital audio players, digital cameras, digital video recorders, to mention a few examples.

Thus, there is a need for a way to store a large amount of data in dense multi-level cells while ensuring that sensitive data is stored in a fashion that sufficiently reduces the possibility of read errors.

BRIEF DESCRIPTION OF THE DRAWINGS

FIG. 2 is a depiction of a cell in accordance with one embodiment of the present invention;

FIG. 3 is a depiction of another cell in accordance with another embodiment of the present invention;

FIG. 4 is a depiction of still another cell in accordance with one embodiment of the present invention.

DETAILED DESCRIPTION

Figure 1:
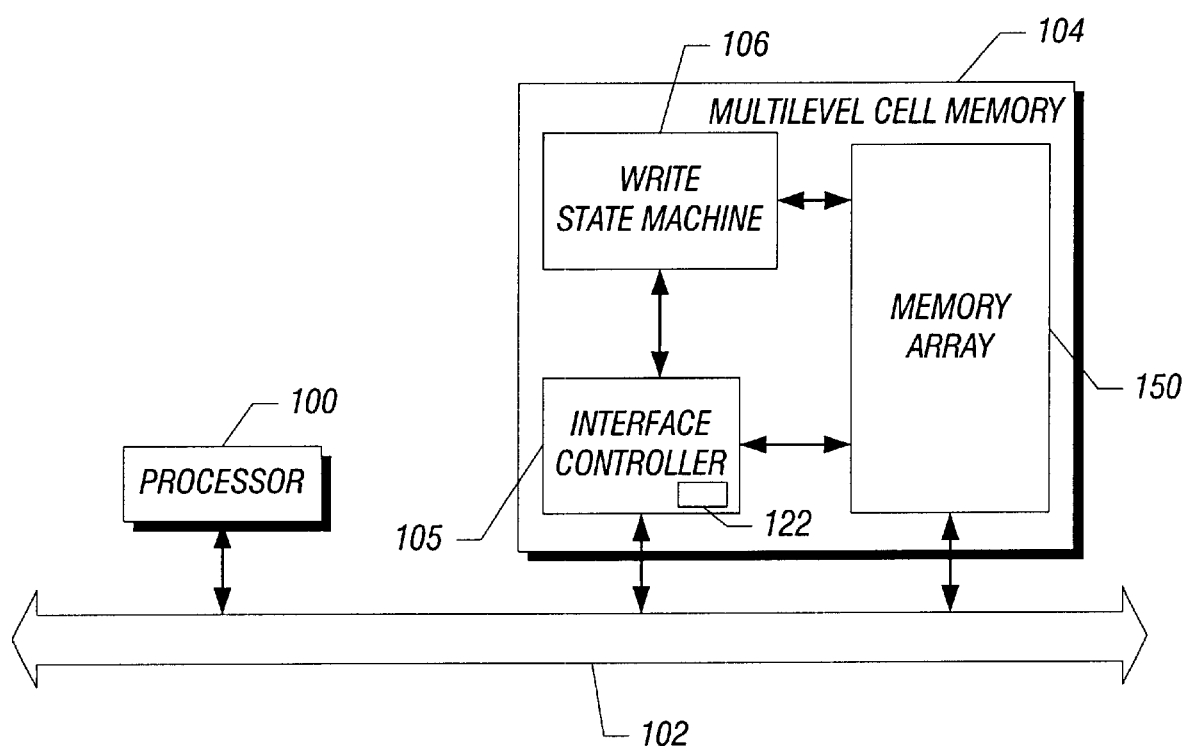
FIG. 1 is a block depiction of one embodiment of the present invention.

Referring to FIG. 1, a processor 100 may be coupled through a bus 102 to a multi-level cell memory 104. The memory 104 contains an interface controller 105, a write state machine 106 and a multi-level cell memory array 150. The processor 100 is coupled by the bus 102 to both the interface controller 105 and the memory array 150 in one embodiment of the present invention. The interface controller 105 provides control over the multi-level cell memory array 150. The write state machine 106 communicates with the interface controller 105 and the memory array 150. The interface controller 105 passes data to be written into the array 150 to the state machine 106. The state machine 106 executes a sequence of events to write data into the array 150. In one embodiment, the interface controller 105, the write state machine 106 and the multi-level cell memory array 150 are located on a single integrated circuit die.

Although embodiments are described in conjunction with a memory array 150 storing one, two or four bits per cell, any number of bits may be stored in a single cell, for example, by increasing the number of threshold levels, without deviating from the spirit and scope of the present invention. Although embodiments of the present invention are described in conjunction with a memory array 150 of flash cells, other cells such as read only memory (ROM), erasable programmable read only memory (EPROM) conventional electrically erasable programmable read only memory (EEPROM), or dynamic random access memory (DRAM), to mention a few examples, may be substituted without deviating from the spirit and scope of the present invention.

Figures 2, 3, 4:
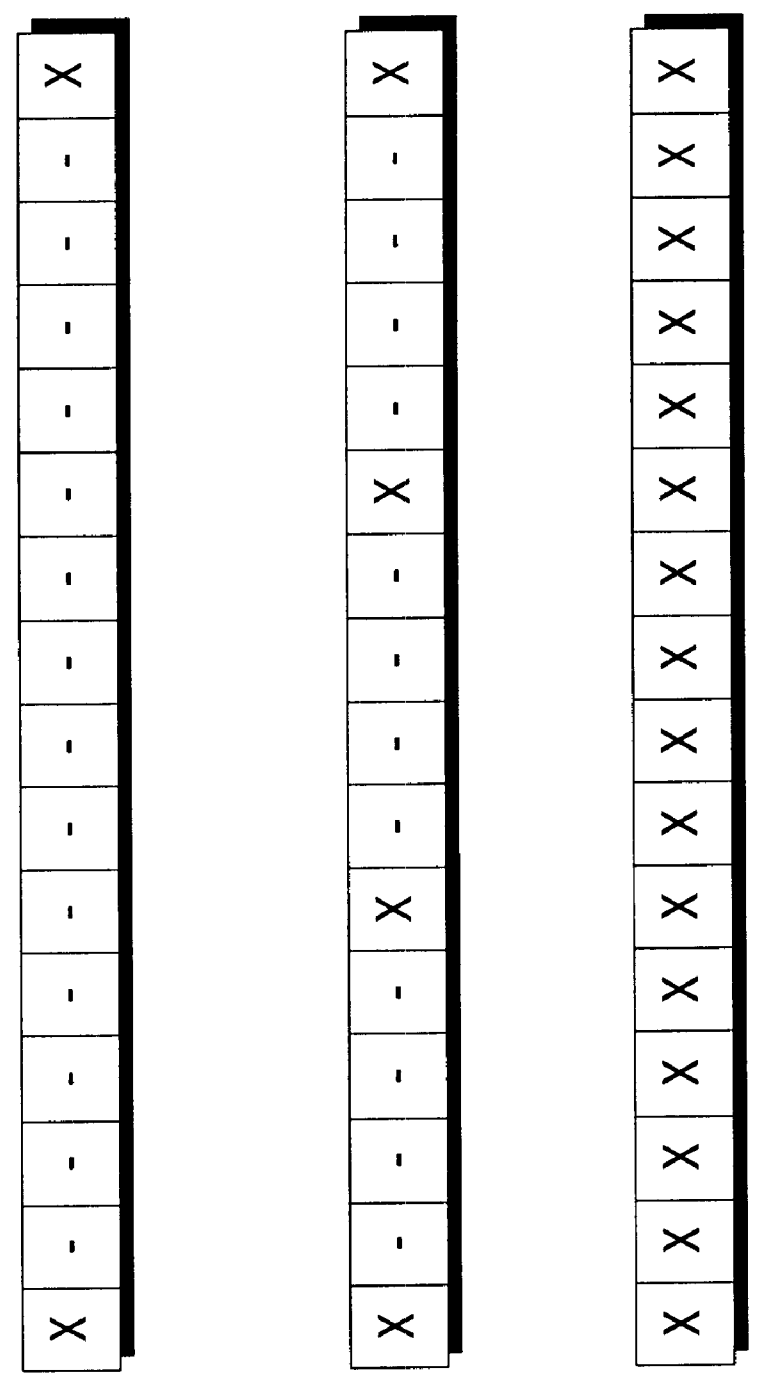

Referring to FIG. 2, a cell may include only one bit of data at the first and last states of the cell. In the embodiments shown in FIGS. 2, 3 and 4, the actual storage of data is indicated by an X and empty states are indicated by dashes. A similarly sized cell, shown in FIG. 3, may store two bits per cell at every fifth level within the cell. Likewise, as shown in FIG. 4, the same sized cell may store four bits per cell using every single state or level of the sixteen available states in this example.

Thus, in some embodiments of the present invention, the number of bits per cell may be changed to increase the fidelity of the stored data. Thus, if density is more important than fidelity, the scheme shown in FIG. 4 or other higher density schemes may be utilized. Conversely, when fidelity is more important, the data may be spread in the cell, decreasing the density per cell and increasing the number of cells required to store all of the data. With wider spacing between the states that are utilized, the integrity of the data storage will be improved. This is because it is easier to discern the differential voltage between significantly non-adjacent levels. In fact, the greater the distance between the levels, the easier it is to discern a differential voltage.

Thus, in the embodiment shown in FIG. 2, only two levels are used, and in the embodiment shown in FIG. 3, four levels are used. In the embodiment shown in FIG. 4, all sixteen levels are utilized in accordance with some embodiments of the present invention.

Thus, in some embodiments, data may be stored in varying numbers of bits per cell depending on the type of data involved. Thus, some data may be packed closely as indicated for example in FIG. 4 and other data may be spread farther apart, requiring additional numbers of cells to complete the data storage.

Figure 5:
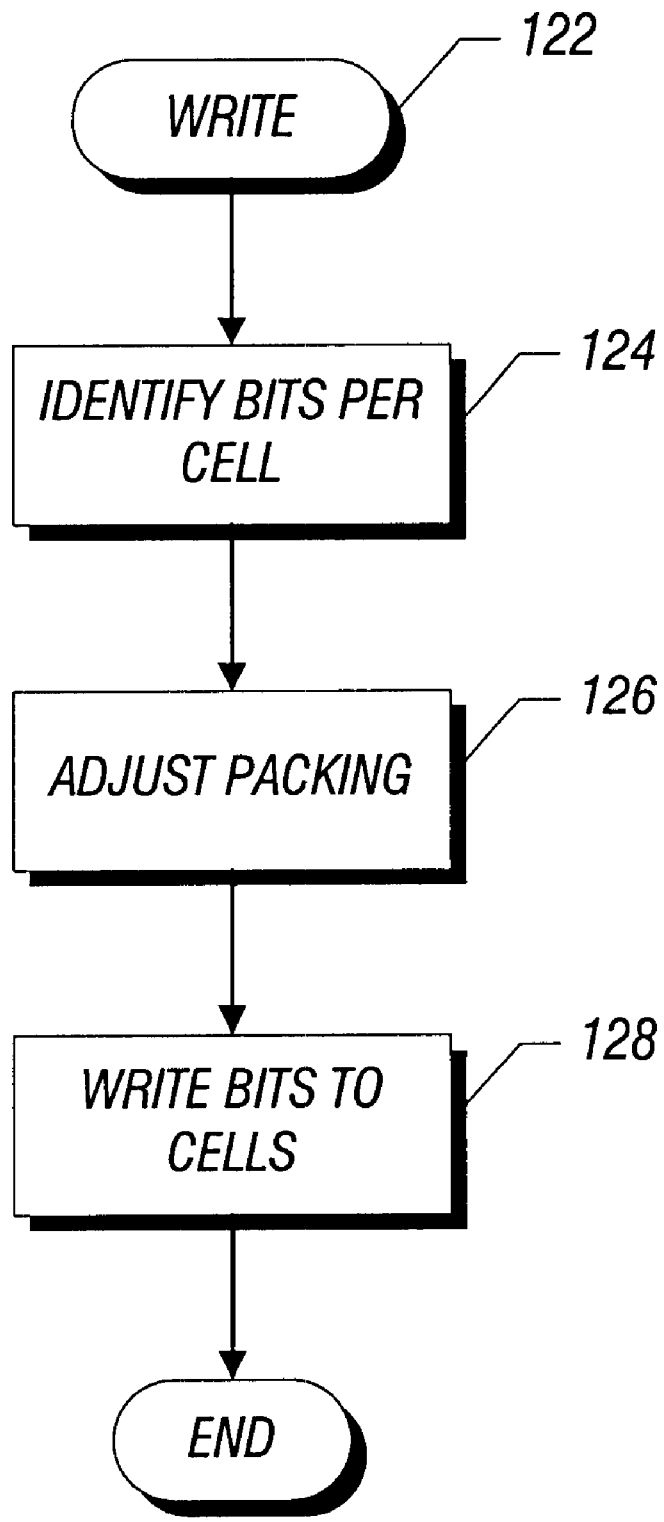
FIG. 5 is a flow chart for software in accordance with one embodiment of the present invention.

Thus, turning to FIG. 5, the write algorithm 122, which may be implemented in software or hardware, initially identifies the number of bits per cell. The number of bits per cell may be derived from information included with the data indicating the desired fidelity. Based on the number of bits per cell, the packing of bits into each given cell may be adjusted. Thus, in some cases, denser packing may be utilized, for example as shown in FIG. 4, and in other cases, looser or more spread apart packing may be utilized as shown in FIG. 2. Once the number of bits per cell has been determined as indicated in block 124, the packing of bits into each cell is adjusted as indicated in block 126. Finally the bits are written to the cells as indicated in block 128. The number of bits per cell may be changed on the fly from cell to cell.

The read process simply reverses the flow, ignoring the missing levels, and simply reading the actual data out of each cell. The spread apart data may then be repacked into a continuous data string.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   storing data at a first density in a first cell in a first memory array;
   storing data at a second density in a second cell in the first memory array;
   changing the number bits stored per cell on the fly.

2. The method of claim 1 wherein storing data at a second density in a second cell includes storing fewer bits per cell in one of said first or second cells.

3. The method of claim 1 including changing the number of bits stored per cell on the fly.

4. The method of claim 2 including storing data at levels which are spaced from one another in said cell in order to improve the read fidelity.

5. The method of claim 4 including storing data in a cell including a plurality of levels and filling less than all of said levels.

6. The method of claim 5 including storing data in regularly spaced levels within a cell while leaving intervening levels within the cell unoccupied by stored data.

7. An article comprising a medium storing instructions, that, if executed, enable a processor-based system to:
   store data at a first density in a first cell in a first memory array;
   store data at a second density in a second cell in said first memory array; and
   change the number of bits stored per cell on the fly.

8. The article of claim 7 further storing instructions that enable the processor-based system to store fever bits per cell in one of said first or second cells.

9. The article of claim 8 further storing instructions that enable the processor-based system to store data at levels which are spaced from one another in said cell in order to improve the read fidelity.

10. The article of claim 9 further storing instructions that enable the processor-based system to store data in a cell including a plurality of levels and fill less than all of said levels.

11. The article of claim 10 further storing instructions that enable the processor-based system to store data in regularly spaced levels within a cell while leaving intervening levels within the cell unoccupied by stored data.

12. A memory comprising:
    a memory array including a first and second cell; and
    a controller coupled to said array to store data in said array at a first density in the first cell and to store data at a second density in the second cell wherein said controller changes the number of bits stored per cell on the fly.

13. The memory of claim 12 wherein said memory is a flash memory.

14. The memory of claim 13 wherein said memory is a multi-level cell memory.

15. The memory of claim 12 wherein said controller stores fewer bits per cell in one of said first or second cells.

16. The memory of claim 12 wherein said controller stores data at levels that are spaced from one another in said cell in order to improve the read fidelity.

17. The memory of claim 16 wherein said controller stores data in a cell including a plurality of levels and fills less than all of the levels.

18. The memory of claim 12 wherein said controller stores data in regularly spaced levels within a cell while leaving intervening levels within the cell unoccupied by stored data.

19. A method comprising:
    storing data at a first density in a first cell in a first memory;
    storing data at a second density in a second cell in the first memory; and
    changing a number orbits stored per cell on the fly.

20. The method of claim 19 wherein storing data at a second density in a second cell includes storing fewer bits per cell in one of said first or second cells.

21. A method comprising:
    storing data at a first density in a first cell in a first memory;
    storing data at a second density in a second cell in the first memory, including storing fewer bits per cell in one of said first or second cells; and
    storing data at levels which are spaced from one another in at least one of said first cell and said second cell in order to improve read fidelity.

22. The method of claim 21 including storing data in a cell including a plurality of levels and tilling less than all of said levels.

23. The method of claim 22 including storing data in regularly spaced levels within a cell while leaving intervening levels within the cell unoccupied by stored data.

24. An article comprising a medium storing instructions that enable a processor-based system to:
    store data at a first density in a first cell in a first memory;
    store data at a second density in a second cell in said first memory; and
    store instructions that enable the processor-based system to change a number of bits stored per cell on the fly.

25. The article of claim 24 further storing instructions that enable the processor-based system to store fewer bits per cell in one of said first or second cells.

26. An article comprising a medium storing instructions that enable a processor-based system to:

store data at a first density in a first cell in a first memory;
store data at a second density in a second cell in said first memory; and
store fewer bits per cell in one of said first or second cells; and
store data at levels which are spaced from one another in said cell in order to improve read fidelity.

27. The article of claim 26 further storing instructions that enable the processor-based system to store data in a cell including a plurality of levels and fill less than all of said levels.

28. The article of claim 27 further storing instructions that enable the processor-based system to store data in regularly spaced levels within a cell while leaving intervening levels within the cell unoccupied by stored data.

29. A memory comprising:
a memory array including a first and second cell; and
a controller coupled to said array to store data in said array at a first density in the first cell and to store data at a second density in the second cell, wherein said controller changes a number of bits stored per cell on the fly.

30. The memory of claim 29 wherein said controller stores data at levels that are spaced from one another in said cell in order to improve read fidelity.

31. The memory of claim 30 wherein said controller stores data in a cell including a plurality of levels and fills less than all of the levels.

32. The memory of claim 29 wherein said memory is a flash memory.

33. The memory of claim 32 wherein said memory is a multi-level cell memory.

34. The memory of claim 29 wherein said controller stores fewer bits per cell in one or said first or second cells.

35. A memory comprising:
a memory array including a first and second cell; and
a controller coupled to said array to store data in said array at a first density in the first cell and to store data at a second density in the second cell and to store data in regularly spaced levels within a cell while leaving intervening levels within the cell unoccupied by stored data.

36. The memory of claim 35 wherein said memory is a flash memory.

37. The memory of claim 36 wherein said memory is a multi-level cell memory.

38. The memory of claim 35 wherein said controller stores fewer bits per cell in one or said first or second cells.

39. A method comprising:
storing data at a first density in a first cell in a first memory array;
storing data at a second density in a second cell in the first memory array, so that fewer bits per cell are stored in one of said first and second cells;
storing data at levels which are spaced from one another in said cells.

40. The method of claim 39 including storing data in a cell including a plurality of levels filling less than all of the levels.

41. The method of claim 40 including storing data in regularly spaced levels within a cell while leaving intervening levels within the cell unoccupied by stored data.

42. An article comprising a medium storing instructions that, if executed, enable a processor-based system to:
store data at a first density in a first cell in a first memory array;
store data in a second density in a second cell in said first memory array; and
store data at levels that are spaced from one another in said cell.

43. The article of claim 42 further storing instructions that, if executed, enable the processor-based system to store data in a cell including a plurality of levels that fills less of all of said levels.

44. The article of claim 43 further storing instructions that, if executed, enable the processor-based system to store data in regularly spaced levels within a cell while leaving intervening levels within the cell unoccupied by stored data.

45. A memory comprising:
a memory array including a first and second cell; and
a controller coupled to said array to store data in said array at a first density in a first cell and to store data at a second density in a second cell, and to store data at levels that are spaced from one another in said cells.

46. The memory of claim 45 wherein said controller stores data in a cell including a plurality of levels that fills less than all of the levels.

47. The memory of claim 45 wherein said controller stores data in regularly spaced levels within a cell while leaving intervening levels within the cells unoccupied by stored data.

48. A method comprising:
storing data at a first density in a first cell in a first memory array;
storing data at a second density in a second cell in a first memory array; and
storing data in regularly spaced levels within a cell while leaving intervening levels within the cell unoccupied by stored data.

49. The method of claim 48 including storing data in a cell including a plurality of levels filling less than all said levels.

50. The method of claim 49 including changing the number of bits stored per cell on the fly.

51. An article comprising a medium storing instructions that, if executed, enable a processor-based system to:
store data at a first density in a first cell in a first memory array;
store data at a second density in a second cell in said first memory array; and
store data in regularly spaced levels within a cell while leaving intervening levels within the cell unoccupied by stored data.

52. The article of claim 51 further storing instructions that, if executed, enable a processor-based system to store data at levels which are spaced from one another in said cell in order to improve the read fidelity.

53. The article of claim 52 further storing instructions that, if executed, enable a processor-based system to change the number of bits stored per cell on the fly.

54. A memory comprising:
a memory array including a first and second cell; and
a controller coupled to said array to store data in said array at a first density in the first cell and to store data at a second density in the second cell and to store data in regularly spaced levels within a cell while leaving intervening levels within the cell unoccupied by stored data.

55. The memory of claim 54 wherein said controller stores data in a cell including a plurality of levels that fills less than all of the levels.

56. The memory of claim 55 wherein said controller changes the number of bits stored per cell on the fly.

* * * * *

UNITED STATES PATENT AND TRADEMARK OFFICE
CERTIFICATE OF CORRECTION

PATENT NO. : 6,643,169 B2
DATED : November 4, 2003
INVENTOR(S) : John C. Rudelic and Richard E. Fackenthal It is certified that error appears in the above-identified patent and that said Letters Patent is hereby corrected as shown below:

Column 3,
Line 62, "fever" should be -- fewer --;

Column 4,
Line 36, "orbits" should be -- of bits --;
Line 51, "tilling" should be -- filling --;

Column 5,
Line 2, "a," should be -- a --.

Signed and Sealed this

Thirteenth Day of January, 2004

JON W. DUDAS
*Acting Director of the United States Patent and Trademark Office*